United States Patent
Kim et al.

(10) Patent No.: US 10,586,868 B2
(45) Date of Patent: Mar. 10, 2020

(54) NON-PLANAR SEMICONDUCTOR DEVICE HAVING HYBRID GEOMETRY-BASED ACTIVE REGION

(71) Applicant: Intel Corporation, Santa Clara, CA (US)

(72) Inventors: Seiyon Kim, Portland, OR (US); Rafael Rios, Portland, OR (US); Fahmida Ferdousi, Hillsboro, OR (US); Kelin J. Kuhn, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 15/024,714

(22) PCT Filed: Dec. 19, 2013

(86) PCT No.: PCT/US2013/076651
§ 371 (c)(1),
(2) Date: Mar. 24, 2016

(87) PCT Pub. No.: WO2015/094301
PCT Pub. Date: Jun. 25, 2015

(65) Prior Publication Data
US 2016/0276484 A1    Sep. 22, 2016

(51) Int. Cl.
*H01L 29/78*    (2006.01)
*B82Y 10/00*    (2011.01)
(Continued)

(52) U.S. Cl.
CPC .......... *H01L 29/7853* (2013.01); *B82Y 10/00* (2013.01); *B82Y 40/00* (2013.01);
(Continued)

(58) Field of Classification Search
CPC ......... H01L 29/66977; H01L 29/66477; H01L 29/42392; H01L 29/78696; H01L 29/0673;
(Continued)

(56) References Cited

U.S. PATENT DOCUMENTS 8,389,416 B2    3/2013 Luong
8,753,942 B2    6/2014 Kuhn et al.
(Continued)

FOREIGN PATENT DOCUMENTS

CN    1801478    7/2006
CN    102623384    8/2012
(Continued)

OTHER PUBLICATIONS

International Preliminary Report on Patentability for PCT Application PCT/US2013/076651 mailed Jun. 30, 2016, 7 pages.
(Continued)

*Primary Examiner* — Joseph M Galvin, III
(74) *Attorney, Agent, or Firm* — Schwabe, Williamson & Wyatt, P.C.

(57) ABSTRACT

Non-planar semiconductor devices having hybrid geometry-based active regions are described. For example, a semiconductor device includes a hybrid channel region including a nanowire portion disposed above an omega-FET portion disposed above a fin-FET portion. A gate stack is disposed on exposed surfaces of the hybrid channel region. The gate stack includes a gate dielectric layer and a gate electrode disposed on the gate dielectric layer. Source and drain regions are disposed on either side of the hybrid channel region.

5 Claims, 7 Drawing Sheets

(51) Int. Cl.
*B82Y 40/00* (2011.01)
*H01L 29/66* (2006.01)
*H01L 29/775* (2006.01)
*H01L 29/06* (2006.01)
*H01L 29/16* (2006.01)
*H01L 29/423* (2006.01)
*H01L 21/02* (2006.01)
*H01L 21/306* (2006.01)
*H01L 29/10* (2006.01)
*H01L 29/786* (2006.01)

(52) U.S. Cl.
CPC .. *H01L 21/02532* (2013.01); *H01L 21/30604* (2013.01); *H01L 29/0673* (2013.01); *H01L 29/0684* (2013.01); *H01L 29/1037* (2013.01); *H01L 29/1054* (2013.01); *H01L 29/16* (2013.01); *H01L 29/42392* (2013.01); *H01L 29/66439* (2013.01); *H01L 29/66545* (2013.01); *H01L 29/66795* (2013.01); *H01L 29/775* (2013.01); *H01L 29/7851* (2013.01); *H01L 29/78696* (2013.01)

(58) Field of Classification Search
CPC ............... H01L 21/268; H01L 29/7845; H01L 29/42356; H01L 29/66787; H01L 29/0847; H01L 21/823807; H01L 21/025; H01L 21/845; H01L 29/785; H01L 27/1211; H01L 29/66795; H01L 29/66439; H01L 21/02603; H01L 29/41791; B82Y 40/00
See application file for complete search history.

(56) References Cited

U.S. PATENT DOCUMENTS

| | | |
|---|---|---|
| 2005/0142766 A1 | 6/2005 | Hareland et al. |
| 2008/0135949 A1 | 6/2008 | Lo et al. |
| 2010/0059807 A1 | 3/2010 | Cho et al. |
| 2013/0075797 A1* | 3/2013 | Okano .............. H01L 29/66795 257/288 |
| 2013/0153997 A1 | 6/2013 | Chang et al. |
| 2013/0313513 A1 | 11/2013 | Cappellani et al. |
| 2013/0320294 A1 | 12/2013 | Cappellani et al. |
| 2014/0042386 A1* | 2/2014 | Cea ................... H01L 29/42392 257/9 |
| 2014/0131660 A1* | 5/2014 | Cea ................... H01L 29/42392 257/24 |
| 2014/0197377 A1 | 7/2014 | Kim |

FOREIGN PATENT DOCUMENTS

| | | |
|---|---|---|
| CN | 103238208 | 8/2013 |
| TW | 201351647 | 12/2013 |
| WO | WO-2013095652 | 6/2013 |

OTHER PUBLICATIONS

Non-Final Office Action for Taiwan Patent Application # 103139909 Mailed Jan. 28, 2016, 3 pages.
International Search Report and Written Opinion from PCT/US2013/076651 Mailed Sep. 17, 2014, 10 pages.
Extended European Search Report for European Patent Application No. 13899577 dated May 30, 2017, 8 pgs.
First Office Action for Chinese Patent Application No. 201380081046.4 dated Jul. 27, 2018, 10 pgs., no translation.
Office Action from U.S. Appl. No. 16/108,610 dated May 14, 2019, 8 pages.
Notice of Allowance from Chinese Patent Application No. 201380081046.4 dated May 16, 2019, 8 pgs.
U.S. Notice of Allowance from U.S. Appl. No. 15/024,714 dated Nov. 15, 2019, 10 pgs.
U.S. Office Action from U.S. Appl. No. 16/108,610 dated Sep. 5, 2019, 10 pgs.

* cited by examiner

300

| | One wire | Multi wire | Omega FET | Fin |
|---|---|---|---|---|
| Fin | 300A, 302A | 300B, 302B | 300C, 302C, 304C, 306C, 310C | 300D, 302D |
| Omega FET | 300E, 302E, 304E, 306E, 310E | 300F, 302F, 304F, 306F, 308F, 310F | 300G, 302G, 304G | 300H, 302H |
| Wire | 300I, 302I | 300J, 302J | 300K, 302K, 304K, 306K, 310K | 300L, 302L |
| Omega plus fin | 300M, 302M, 304M, 306M, 308M, 310M | 300N, 302N, 304N, 305N, 308N, 310N, 306N | 300O, 302O, 304O | 300P, 302P, 304P, 306P, 308P, 310P |

FIG. 3

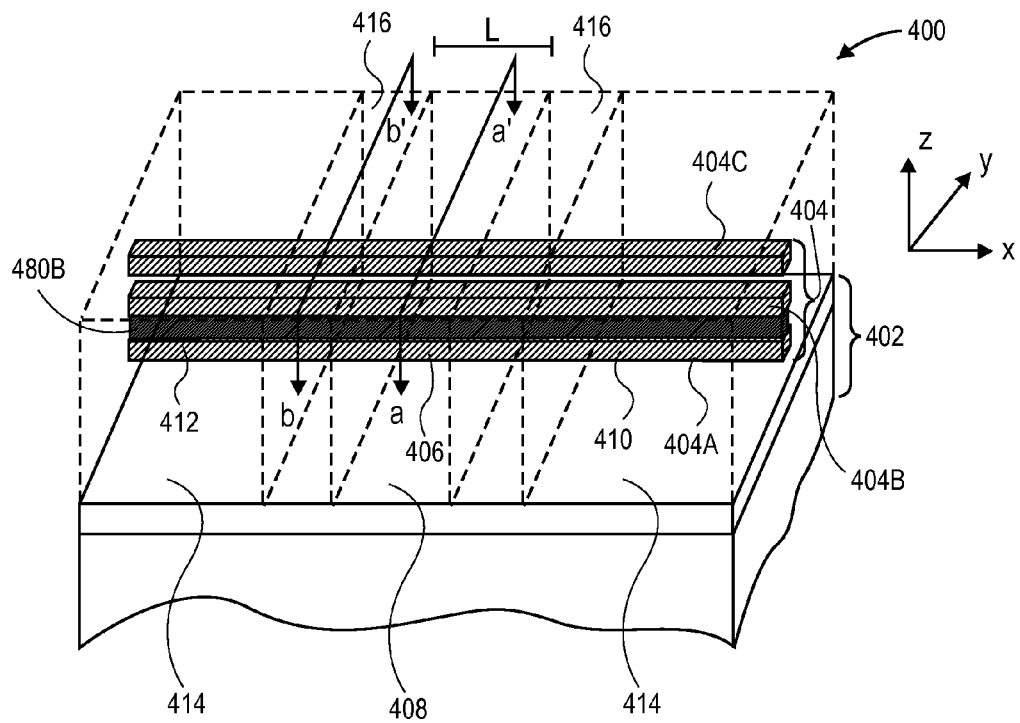
FIG. 4A
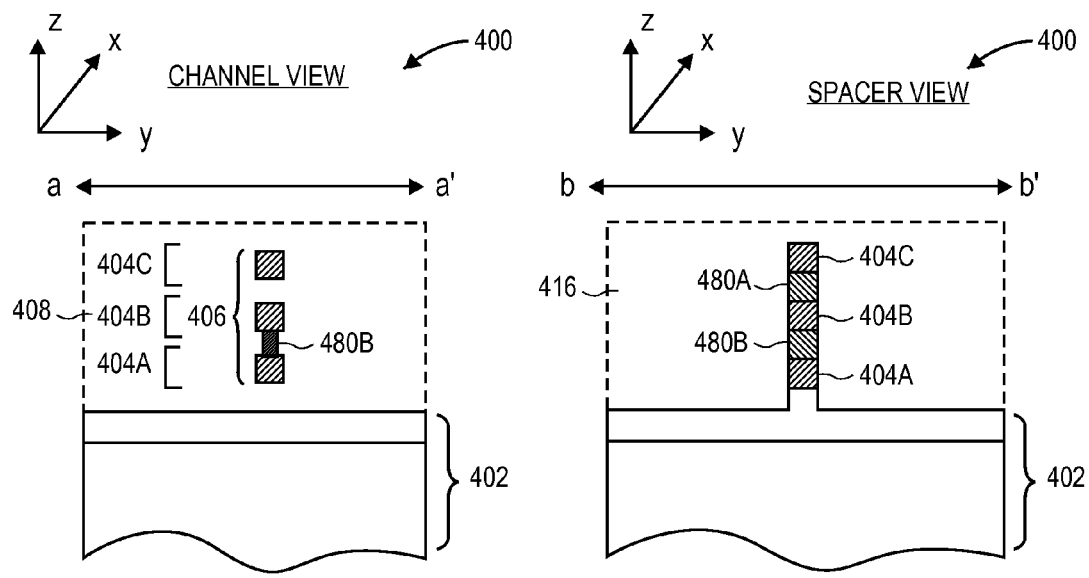
FIG. 4B   FIG. 4C

NON-PLANAR SEMICONDUCTOR DEVICE HAVING HYBRID GEOMETRY-BASED ACTIVE REGION

CLAIM OF PRIORITY

This application is a U.S. National Phase application under 35 U.S.C. §371 of International Application No. PCT/US2013/076651, filed Dec. 19, 2013, entitled "NON-PLANAR SEMICONDUCTOR DEVICE HAVING HYBRID GEOMETRY-BASED ACTIVE REGION" the entire contents of which are incorporated herein by reference.

TECHNICAL FIELD

Embodiments of the invention are in the field of semiconductor devices and, in particular, non-planar semiconductor devices having hybrid geometry-based active regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, or gate-all-around devices, such as nanowires, have become more prevalent as device dimensions continue to scale down. Many different techniques have been attempted to reduce channel or external resistance of such transistors. However, significant improvements are still needed in the area of channel or external resistance suppression. Also, many different techniques have been attempted to manufacture devices with non-Si channel materials such as SiGe, Ge, and III-V materials. However, significant process improvements are still needed to integrate these materials onto Si wafers.

BRIEF DESCRIPTION OF THE DRAWINGS

FIG. 3 is a Table depicting cross-section views of a variety of achievable hybrid geometry-based active regions formed using a release etch, with device types contributing to the hybrid geometry listed along the vertical and horizontal axes, in accordance with an embodiment of the present invention.

FIG. 4A illustrates a three-dimensional cross-sectional view of a nanowire-based semiconductor structure having a hybrid geometry-based active region, in accordance with an embodiment of the present invention.

FIG. 4B illustrates a cross-sectional channel view of the nanowire-based semiconductor structure of FIG. 4A, as taken along the a-a' axis, in accordance with an embodiment of the present invention.

FIG. 4C illustrates a cross-sectional spacer view of the nanowire-based semiconductor structure of FIG. 4A, as taken along the b-b' axis, in accordance with an embodiment of the present invention.

DESCRIPTION OF THE EMBODIMENTS

Non-planar semiconductor devices having hybrid geometry-based active regions are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to nanowire-trigate-omega field effect transistor (FET) hybrid MOS transistors. Hybrid geometries for active regions of such devices include geometries contributed by, or dominated by, finFET geometries, nanowire geometries, or trigate geometries.

Generally, new device structures are described that take advantage of a hybrid contribution of two of nanowire, trigate, or omega FET architectures. One or more embodiments include devices using such hybrid active regions having reduced external resistance (Rext) and capacitance as otherwise observed for fully formed nanowire-type transistors. Furthermore, improved short channel effects (e.g., reduced leakage) are achieved as otherwise observed for trigate devices. Thus, semiconductor device manufacturing schemes targeting optimal structures for taking advantages of trigate, omega FET and wire transistors into a single device are described herein. One or more embodiments may be applicable for high performance, low leakage logic complementary metal oxide semiconductor (CMOS) devices.

More specifically, one or more embodiments described herein are directed to approaches for forming silicon (Si)-containing non-planar architectures. For example, in an embodiment one or more devices described herein may be characterized as a Si-based device, a nanoribbon-based device, a nanowire-based device, a non-planar transistor, an omega-FET, a trigate-based device, a multi-gate device, or a combination thereof. More specifically, one or more embodiments are directed to performing a total or partial release of Si-containing features from SiGe/Si multilayer stacks.

Figure 1:
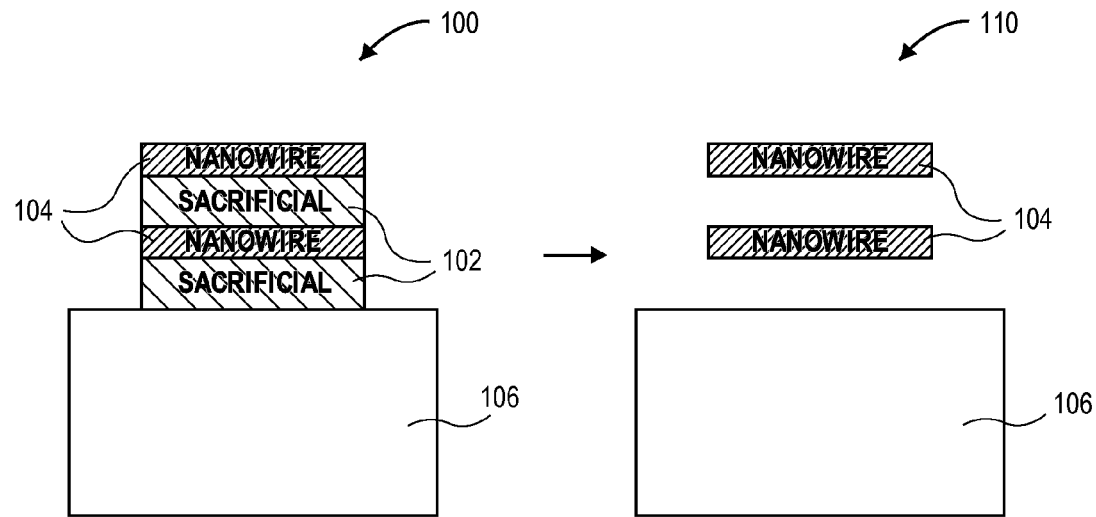
FIG. 1 illustrates a cross-sectional view of a state-of-the-art release etch process taken along a channel region of a multi-wire semiconductor device.

To provide context, FIG. 1 illustrates a cross-sectional view of a state-of-the-art release etch process taken along a channel region of a multi-wire semiconductor device. Referring to FIG. 1, a channel cut of a semiconductor stack 100 having a plurality of sacrificial layers 102 and silicon-based nanowire structures 104 is formed above a substrate 106. Upon selectively etching to remove the sacrificial layers 102 to provide released stack 110, a channel region is formed based on nanowire structures 104 is etched due to high selectivity. In the specific case shown in FIG. 1, rectangular nanowire structures 104 with squared corners are essentially preserved during the release etch to leave released rectangular nanowire structures 104 with squared corners.

By contrast, in accordance with an embodiment of the present invention, hybrid geometry structures are formed by utilizing variable sacrificial epitaxial layers. For example, a single wire/omega/fin hybrid can be made by starting with Si/SiGe/Si/SiGe, where the epitaxial SiGe layers have different relative Ge concentrations. As an example, FIG. 2 illustrates a cross-sectional view of a release etch process taken along a channel region of a multi-wire semiconductor device, in accordance with an embodiment of the present invention.

Figure 2:
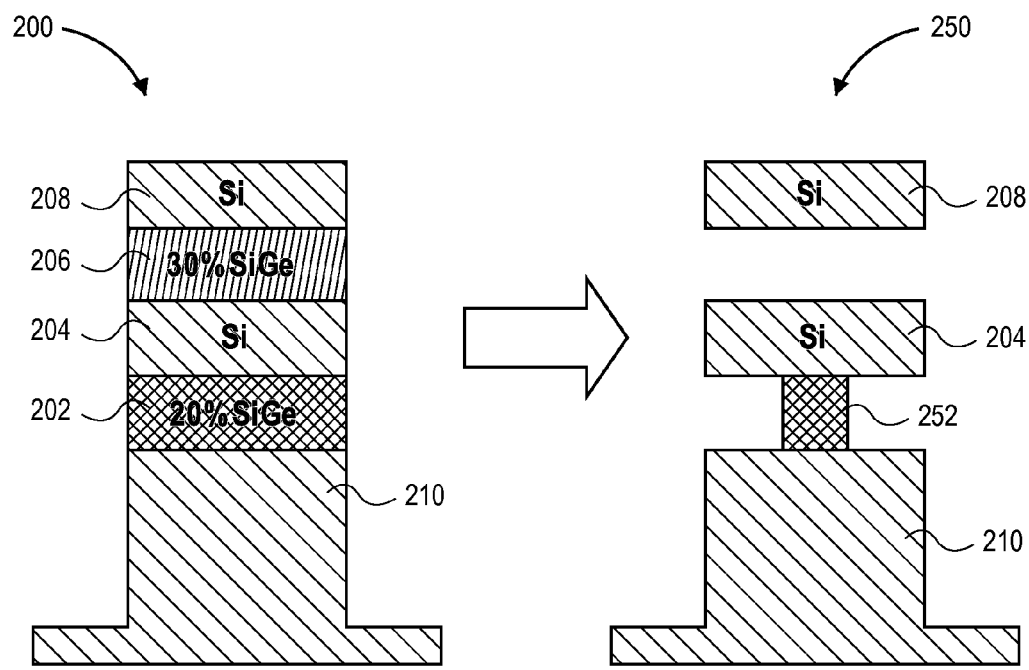
FIG. 2 illustrates a cross-sectional view of a release etch process taken along a channel region of a multi-wire semiconductor device, in accordance with an embodiment of the present invention.

Referring to FIG. 2, a channel cut of a semiconductor stack 200 has a first sacrificial layer 202, a first silicon layer 204, a second sacrificial layer 206, and a second silicon layer 208 formed above a substrate 210. The first sacrificial layer 202 has a composition closer to silicon than the second sacrificial layer 206. For example, in one embodiment, the first sacrificial layer 202 is composed of 20% germanium and 80% silicon, while the second sacrificial layer 206 is composed of 30% germanium and 70% silicon. Thus, referring to the resulting structure 250, when applying an etch that favors germanium over silicon, the second sacrificial layer 206 etches faster than the first sacrificial layer 202. Furthermore, upon terminating the selective etching after complete removal of the second sacrificial layer 206, but prior to complete removal of the first sacrificial layer 202, a portion 252 of the second sacrificial layer 206 can be retained in the final channel region stack. In the particular example shown in FIG. 2, the silicon layer 208 forms a nanowire channel portion upon release. The silicon layer 204 and the portion 252 of the second sacrificial layer 206 form an omega FET portion. And, in the case of a bulk silicon substrate 210, the protruding portion of the substrate 210 forms a fin-FET or trigate portion.

Referring again to FIG. 2, in an exemplary embodiment, the release layers 202 and 206 are composed of silicon germanium. It is to be appreciated that although described above as 20%-Ge-based SiGe and 30%-Ge-based SiGe, respectively, the above selective etching to remove all of one layer while retaining a portion of another layer can be achieved for a variety of pairings of $Si_xGe_{1-x}$ for layer 202 and $Si_yGe_{1-y}$ for layer 206, where x>y. It is also to be appreciated that the sacrificial layers 202 and 206 may be reversed in location in order to retain a portion of the second sacrificial layer 206, yet completely removing the first sacrificial layer 202, and providing a different hybrid geometry. Other stacks providing a similar etch differentiating arrangements may also be used. For example, in an embodiment, an appropriate arrangement of group III-V materials may be used instead of the above described hetero-structure based on silicon and silicon germanium layers.

In an embodiment, the fully retained layers 204 and 208 and possibly the substrate 210 and are composed essentially of silicon. The terms silicon, pure silicon or essentially pure silicon may be used to describe a silicon material composed of a very substantial amount of, if not all, silicon. However, it is to be understood that, practically, 100% pure silicon may be difficult to form in the presence of silicon germanium release layers and, hence, could include a tiny percentage of Ge. The Ge may be included as an unavoidable impurity or component during deposition of Si or may "contaminate" the Si upon diffusion during post deposition processing. As such, embodiments described herein directed to a Si channel portion may include Si channel portions that contain a relatively small amount, e.g., "impurity" level, non-Si atoms or species, such as Ge. By contrast, active regions that include a retained portion of a silicon germanium release layer have a significant amount of germanium, e.g., a sufficient amount to provide etch selectivity relative to adjacent retained "pure" silicon features.

Referring again to FIG. 2, in an embodiment where the layers of semiconductor material 204 and 208 are silicon and the layers of sacrificial material 202 and 206 are silicon germanium, the layers of sacrificial material 202 and 206 may be selectively removed using a wet etchant such as, but not limited to aqueous carboxylic acid/nitric acid/HF solution and aqueous citric acid/nitric acid/HF solution. The total or partial removal of the layers of sacrificial material layers 202 and 206 relative to one another can be tailored based on the relative amount of germanium included in the respective layer.

Referring again to FIG. 2, in an embodiment, the stack of the first sacrificial layer 202, the first silicon layer 204, the second sacrificial layer 206, and the second silicon layer 208 is formed on a silicon substrate. More particularly, the stack of layers may be formed on a silicon substrate and then etched, with the fin patterning etch extending partially into the substrate portion to provide a structure such as is shown on the left-hand side of FIG. 2. In it to be appreciated that substrates other than silicon may be used, such as, but not limited to, germanium, silicon-germanium or a III-V substrate. In any case, the silicon (or other) substrate is referred to as a bulk substrate, and devices formed there from are referred to as bulk devices. Examples of channel regions of such devices are depicted in FIG. 3. It is to be appreciated that, in the case of bulk devices, a subsequently formed permanent gate stack may be isolated from the bulk semiconductor substrate by a shallow trench isolation (STI) region or a bottom gate isolation (BGI) structure. In other embodiments, a global insulating layer is disposed on the substrate, below the channel layers. FIGS. 4A-4C, described below, include an example of such devices.

As described in greater detail below, a variety of geometries for channel regions are achievable using controlled etching of release layers. Semiconductor devices based on such channel regions may be a semiconductor device incorporating a gate, and a pair of source/drain regions. In an embodiment, the semiconductor device is a MOS-FET. In one embodiment, the semiconductor device is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit. Furthermore, additional interconnect wiring may be fabricated in order to integrate such devices into an integrated circuit.

In accordance with an embodiment of the present invention, then, epitaxial layer composition and undercut etch can enable one or more of nanowire/trigate/omega FET portions combined in single device. The hybrid structures can be utilized to optimize device performance and power consumption. Flexibility in device channel structure may provide pathways to optimize the device per application. As an example, FIG. 3 is a Table 300 depicting cross-section views of a variety of achievable hybrid geometry-based active regions formed above a corresponding substrate 302 using a release etch, with device types contributing to the hybrid geometry listed along the vertical and horizontal axes, in accordance with an embodiment of the present invention.

Referring to Table 300, in an embodiment, two or more release layers are used for hybrid channel region formation, where one of the release layers has a different etch rate (e.g., by having less germanium) than the other release layer(s). For example, the fin/omega FET hybrid channel region 300C includes first and second silicon portions 304C and 306C completely released from a third silicon portion 308C. A portion of a silicon germanium release layer 310C is retained between the first and second silicon portions 304C and 306C. In another example, the omega FET/one wire hybrid channel region 300E includes a first silicon portion 304E completely released from a second silicon portion 306E. A portion of a silicon germanium release layer 310E is retained below the second silicon portion 306E. In another example, the omega FET/multi wire hybrid channel region 300F includes a first silicon portion 304F completely released from a second silicon portion 306F which is completely released from a third silicon portion 308F. A portion of a silicon germanium release layer 310F is retained below the third silicon portion 308F. In another example, the wire/omega FET hybrid channel region 300K includes a first silicon portion 304K and a second silicon portion 306K completely released from the substrate 302K. A portion of a silicon germanium release layer 310K is retained between the first silicon portion 304K and the second silicon portion 306K. In another example, the omega plus fin/one wire hybrid channel region 300M includes a first silicon portion 304M completely released from a second silicon portion 306M. The second silicon portion 306M is coupled to a third silicon portion 308M by a portion of a silicon germanium release layer 310M. In another example, the omega plus fin/multi wire hybrid channel region 300N includes a first silicon portion 304N completely released from a second silicon portion 306M completely released from a third silicon portion 305N. The third silicon portion 305N is coupled to a fourth silicon portion 308N by a portion of a silicon germanium release layer 310N. In another example, the omega plus fin/fin hybrid channel region 300P includes a first silicon fin portion 304P completely released from a second silicon portion 306P. The second silicon portion 306P is coupled to a third silicon portion 308P by a portion of a silicon germanium release layer 310P.

In another embodiment, hybrid structures are formed by retaining portions of all release layers. In a first example, the omega FET/omega FET hybrid 300G includes silicon regions 302G and partially etched silicon germanium release layers 304G. In a second example, the omega plus fin/omega FET hybrid 300O includes silicon regions 302O and partially etched silicon germanium release layers 304O. In yet another embodiment, hybrid structures are formed by completely etching all release layers present. Examples include the fin/one wire hybrid 300A and the fin/multi wire hybrid 300B. Finally, it is to be appreciated that several "hybrid" examples in Table 300 are not actually hybrid structures but are presented for completeness of Table 300: the fin/fin structure 300D the wire/one wire structure 300I, the wire/multi wire structure 300J, and the wire/fin structure 300L (which is actually a vertical nanoribbon).

As mentioned above, hybrid channel regions structure need not be fabricated from a bulk substrate, but instead may be fabricated above an insulator layer disposed on a substrate. As an example, FIG. 4A illustrates a three-dimensional cross-sectional view of a nanowire-based semiconductor structure having a hybrid geometry-based active region, in accordance with another embodiment of the present invention. FIG. 4B illustrates a cross-sectional channel view of the nanowire-based semiconductor structure of FIG. 4A, as taken along the a-a' axis, in accordance with an embodiment of the present invention. FIG. 4C illustrates a cross-sectional spacer view of the nanowire-based semiconductor structure of FIG. 4A, as taken along the b-b' axis, in accordance with an embodiment of the present invention.

Referring to FIG. 4A, a semiconductor device 400 includes one or more vertically stacked nanowires (404 set) disposed above a substrate 402. Embodiments herein are targeted at both single wire based hybrid devices and multiple wire based devices. As an example, a three nanowire-based devices having nanowires 404A, 404B and 404C, where only the top wire is completely released from the other wires, is shown for illustrative purposes. For convenience of description, nanowire 404A is used as an example where description is focused on only one of the nanowires. It is to be understood that where attributes of one nanowire are described, embodiments based on a plurality of nanowires may have the same attributes for each of the nanowires.

Referring again to FIG. 4A, the top nanowire 404C is completely released from the middle nanowire 404B. However, a portion of a release layer 480B is retained between the middle nanowire 404B and the bottom nanowire 404A. Each of the nanowires 404A-404C and the retained portion of a release layer 480B contribute to a channel region 406, having a length (L).

Referring to both FIGS. 4A and 4B, a gate electrode stack 408 surrounds the entire perimeter of the channel region 406. The gate electrode stack 408 includes a gate electrode along with a gate dielectric layer disposed between the channel region 406 and the gate electrode (not shown). The channel region 406 is discrete in that it is completely surrounded by the gate electrode stack 408 without any intervening material such as underlying substrate material.

In an embodiment, the nanowires 404A-404C may be sized as wires or ribbons, and may have squared-off or rounded corners. In any case, however, in an embodiment, the sizing and shaping of each nanowire 404A-404C is essentially the same as prior to a complete or partial release etch used to fabricate the nanowires 404A-404C. In an embodiment, the nanowires 404A-404C are uniaxially strained nanowires. The uniaxially strained nanowire or plurality of nanowires may be uniaxially strained with tensile strain or with compressive strain, e.g., for NMOS or PMOS, respectively.

The width and height of each of the nanowires 404A-404C is shown as approximately the same, however, they need not be. For example, in another embodiment (not shown), the width of the nanowires 404A-404C is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 404A-404C has a width and a height, the width substantially less than the height.

Referring again to FIG. 4A, source and drain regions 410 and 412 are included on either side of the channel region 406. A pair of contacts 414 is disposed over the source/drain regions 410/412. In an embodiment, the semiconductor device 400 further includes a pair of spacers 416. The spacers 416 are disposed between the gate electrode stack 408 and the pair of contacts 414. As described above, one or more of the nanowires 404A-404C, in at least several embodiments, is made to be discrete (e.g., by a selective wet etch process). However, not all regions of the nanowires 404 need be, or even can be made to be discrete. For example, referring to FIG. 4C, nanowires 404A-404C are not discrete at the location under spacers 416. In one embodiment, the stack of nanowires 404A-404C has intervening semiconductor material 480B and 400A there between. For example, in one embodiment, at the channel region 406, the entire material 480A is removed, while only a portion of 480B is removed, as is depicted in FIGS. 4A and 4B. Referring to FIG. 4C, in the spacer region, where etch access may be hindered, portions of both of 480A and 480B remain. Furthermore, in one embodiment, the bottom nanowire 404A is still in contact with a portion of substrate 402, e.g., in contact with an insulating layer portion disposed on a bulk substrate.

Referring again to FIGS. 4A-4C, the substrate 402 may be composed of a material suitable for semiconductor device fabrication. In one embodiment, substrate 402 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 400 may be fabricated from a starting semiconductor-on-insulator substrate. As such, in one embodiment, the plurality of vertically stacked nanowires 404 is disposed above a bulk crystalline substrate having an intervening dielectric layer disposed thereon, as depicted in FIGS. 4A-4C. Alternatively, the structure 400 is formed directly from a bulk substrate and local oxidation is used to form electrically insulative portions in place of the above described upper insulator layer.

In an embodiment, referring again to FIG. 4A, the gate electrode of gate electrode stack 408 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 404. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 416 are composed of an insulative dielectric material such as, but not limited to, silicon dioxide, silicon oxy-nitride or silicon nitride. The contacts 414 are, in an embodiment, fabricated from a metal species. The metal species may be a pure metal, such as nickel or cobalt, or may be an alloy such as a metal-metal alloy or a metal-semiconductor alloy (e.g., such as a silicide material).

Referring again to FIG. 4A, each of the nanowires 404 also includes source and drain regions 410/412 disposed in or on the nanowire on either side of the channel regions 406. In an embodiment, the source and drain regions 410/412 are embedded source and drain regions, e.g., at least a portion of the nanowires is removed and replaced with a source/drain material region. However, in another embodiment, the source and drain regions 410/412 are composed of, or at least include, portions of the one or more nanowires 404.

In another aspect, a replacement gate process may be used to access channel regions to form hybrid geometry-based channel regions. As an example, FIGS. 5A-5E illustrate three-dimensional cross-sectional views representing various operations in a method of fabricating a semiconductor structure having a hybrid geometry-based active region, in accordance with an embodiment of the present invention.

Figure 5A:
FIGS. 5A-5E illustrate three-dimensional cross-sectional views representing various operations in a method of fabricating a semiconductor structure having a hybrid geometry-based active region, in accordance with an embodiment of the present invention.

Referring to FIG. 5A, a fin 512 is formed above a silicon substrate 502. The fin includes silicon wire-forming layers 504 and 508. A first silicon germanium release layer 506 is disposed between the silicon wire-forming layers 504 and 508. A second silicon germanium release layer 510 is disposed between the silicon wire-forming layer 504 and the silicon substrate 506. In an embodiment, the first silicon germanium release layer 506 has a higher germanium content than the second silicon germanium release layer 510. It is to be appreciated that, in the case of fabrication of bulk devices, a subsequently formed permanent gate stack may be isolated from the silicon substrate 502 by a shallow trench isolation (STI) region formed after fin patterning, but prior to the processes described below in association with FIG. 5B. Alternatively, a subsequently formed permanent gate stack may be isolated from the silicon substrate 502 by a bottom gate isolation (BGI) structure, which may be fabricated at the time of permanent gate stack fabrication.

Figure 5B:
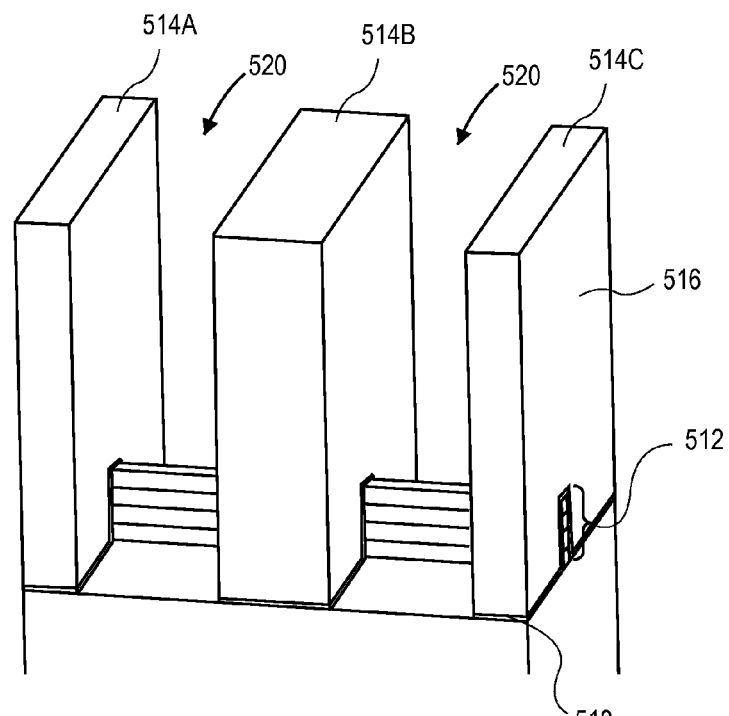

In a specific example showing the formation of three gate structures, FIG. 5B illustrates the fin-type structure 512 with three sacrificial gates 514A, 514B, and 514C disposed thereon. In one such embodiment, the three sacrificial gates 514A, 514B, and 514C are composed of a sacrificial gate oxide layer 518 and a sacrificial polysilicon gate layer 516 which are, e.g., blanket deposited and patterned with a plasma etch process.

Figure 5C:
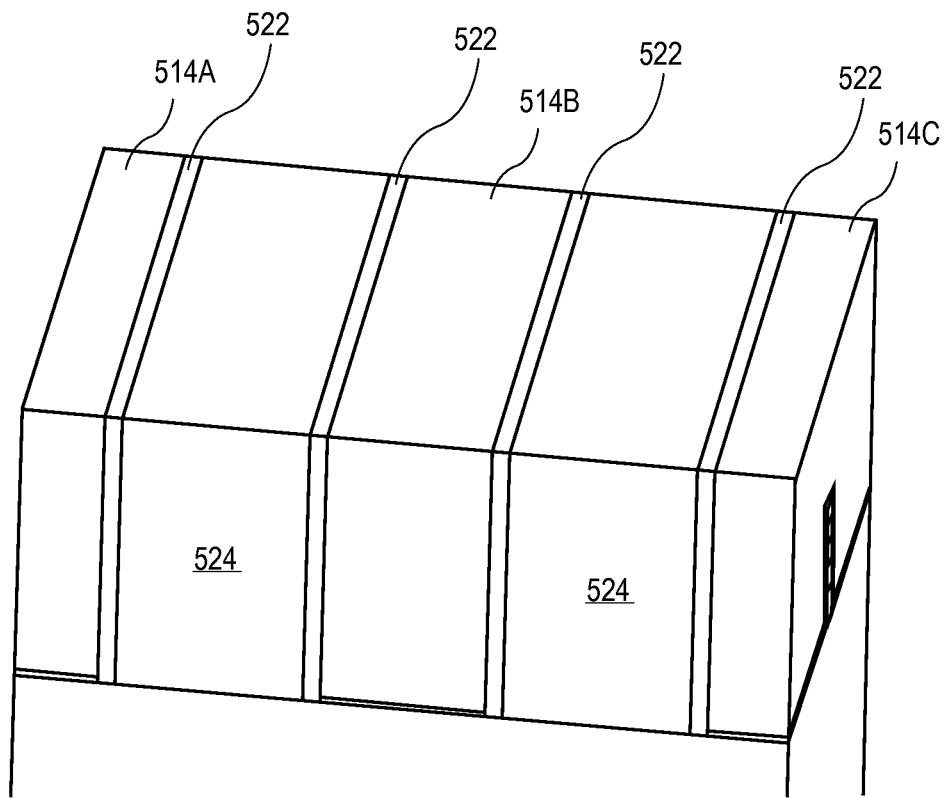

Following patterning to form the three sacrificial gates 514A, 514B, and 514C, spacers may be formed on the sidewalls of the three sacrificial gates 514A, 514B, and 514C, doping may be performed in regions 520 of the fin-type structure 512 shown in FIG. 5B (e.g., tip and/or source and drain type doping), and an interlayer dielectric layer may be formed to cover and then re-expose the three sacrificial gates 514A, 514B, and 514C. The interlayer dielectric layer may then be polished to expose the three sacrificial gates 514A, 514B, and 514C for a replacement gate, or gate-last, process. Referring to FIG. 5C, the three sacrificial gates 514A, 514B, and 514C are exposed, along with spacers 522 and interlayer dielectric layer 524.

Figure 5D:
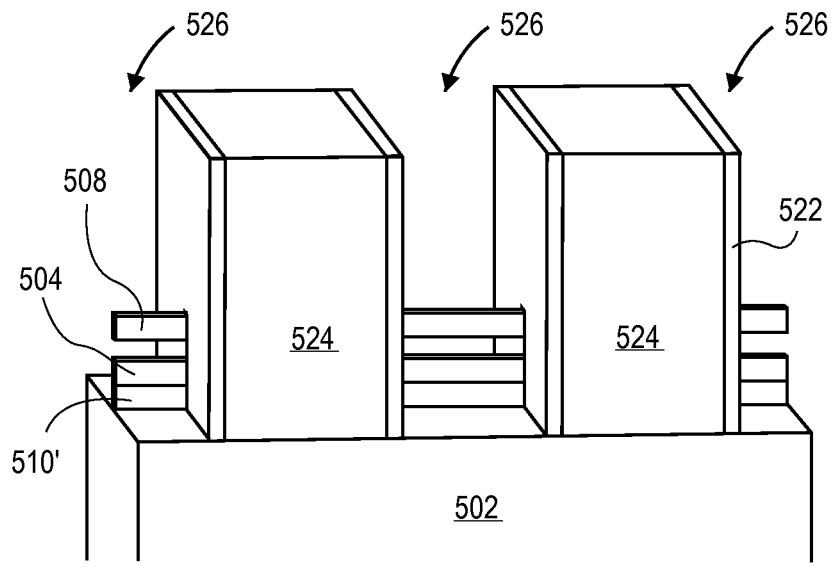

The sacrificial gates 514A, 514B, and 514C may then be removed, e.g., in a replacement gate or gate-last process flow, to expose channel portions of the fin-type structure 512. Referring to FIG. 5D, the sacrificial gates 514A, 514B, and 514C are removed to provide trenches 526 and, thus, reveal channel locations. As depicted in FIG. 5D, a selective etch process is used to completely remove the first silicon germanium release layer 506, but only to partially remove the second silicon germanium release layer 510 (i.e., to form thinned second silicon germanium release layer 510'), thus forming a hybrid channel region in channel location 526. In the particular example shown, a hybrid channel region such as the omega FET/one wire hybrid channel region 300E is formed.

Figure 5E:
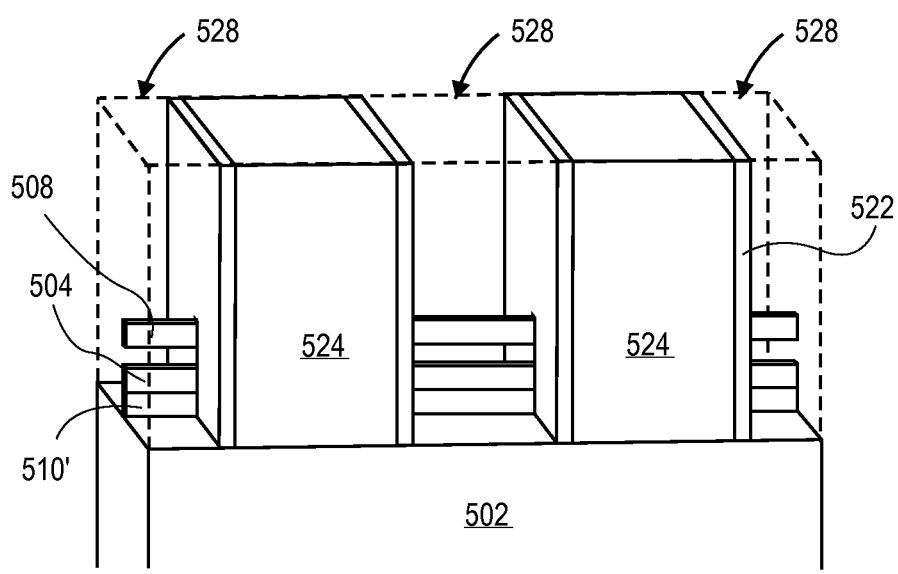

Following formation of the hybrid channel region as depicted in FIG. 5D, high-k gate dielectric and metal gate processing to form gate stacks 528 may be performed, as depicted in FIG. 5E. Additionally, source and drain contacts may be added. Although not shown, contacts may be formed in the place of the interlayer dielectric layer 524 portions remaining in FIG. 5E.

Figure 6:
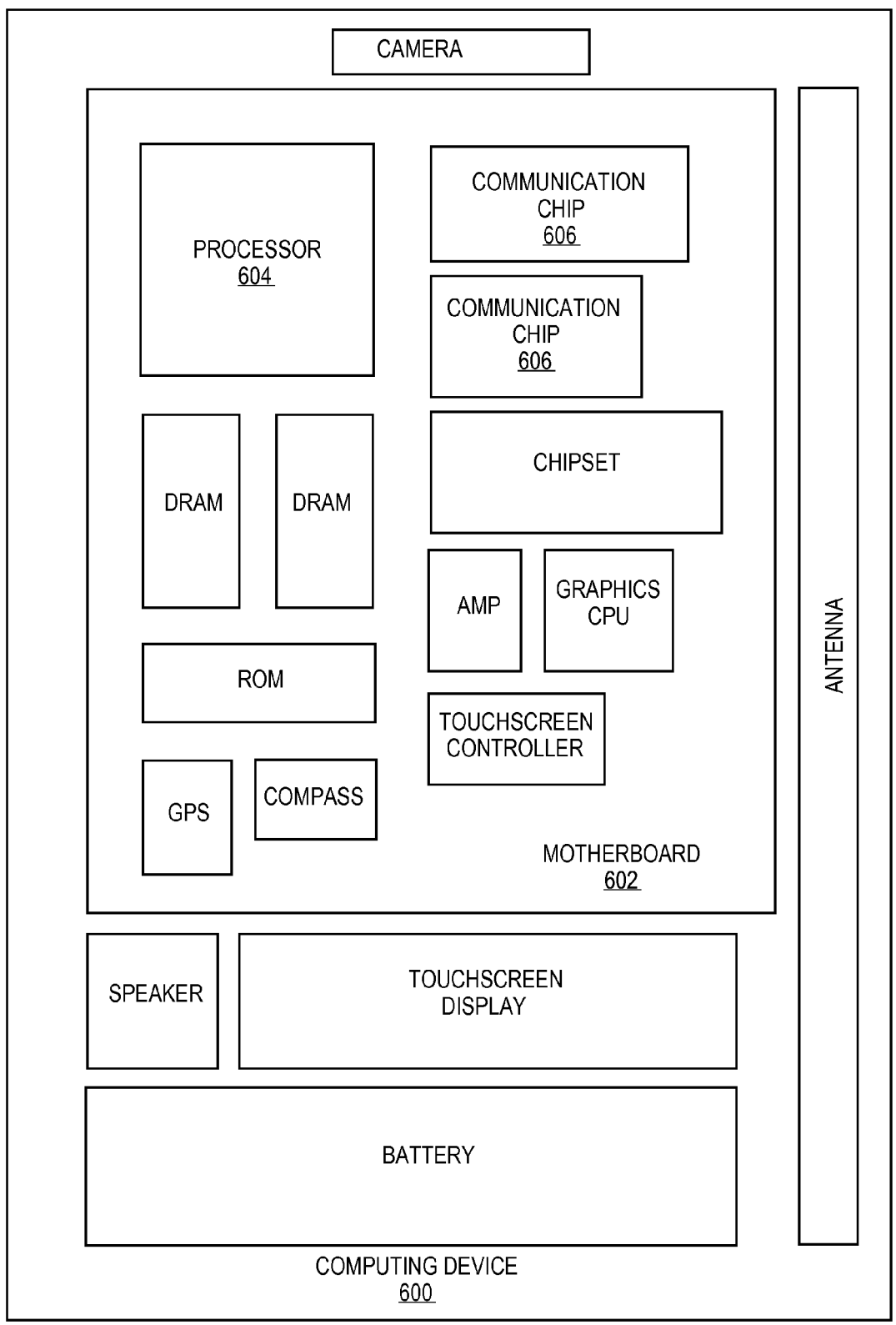
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments of the present invention include non-planar semiconductor devices having hybrid geometry-based active regions.

In an embodiment, a semiconductor device includes a hybrid channel region including a nanowire portion disposed above an omega-FET portion disposed above a fin-FET portion. A gate stack is disposed on exposed surfaces of the hybrid channel region. The gate stack includes a gate dielectric layer and a gate electrode disposed on the gate dielectric layer. Source and drain regions are disposed on either side of the hybrid channel region.

In one embodiment, the nanowire portion and the fin-FET portion of the hybrid channel region consist essentially of a first semiconductor material, and the omega-FET portion includes a bi-layer having an upper layer consisting essentially of the first semiconductor material and a lower layer consisting essentially of a second, different, semiconductor material.

In one embodiment, the first semiconductor material is silicon, and the second semiconductor material is silicon germanium.

In one embodiment, the lower layer of the omega-FET portion of the hybrid channel region is disposed on the fin-FET portion of the hybrid channel region.

In one embodiment, the fin-FET portion of the hybrid channel region is continuous with a bulk semiconductor substrate.

In one embodiment, the gate stack is isolated from the bulk semiconductor substrate by a shallow trench isolation (STI) region or a bottom gate isolation (BGI) structure.

In an embodiment, a semiconductor device includes a hybrid channel region having a first region disposed above a second region disposed above and spaced apart from a third region. The hybrid channel region also includes a fourth region disposed between and in contact with the first and second regions. The first region, the second region and the third region consist essentially of a first semiconductor material. The fourth region consists essentially of a second, different, semiconductor material. A gate stack is disposed on exposed surfaces of the hybrid channel region. The gate stack includes a gate dielectric layer and a gate electrode disposed on the gate dielectric layer. Source and drain regions are disposed on either side of the hybrid channel region.

In one embodiment, the first semiconductor material is silicon, and the second semiconductor material is silicon germanium.

In one embodiment, the hybrid channel region has a length between the source and drain regions, and the fourth semiconductor region is shorter than each of the first, second, and third semiconductor regions in a direction perpendicular to the length of the channel region.

In one embodiment, the third region of the hybrid channel region is continuous with a bulk semiconductor substrate.

In one embodiment, the gate stack is isolated from the bulk semiconductor substrate by a shallow trench isolation (STI) region or a bottom gate isolation (BGI) structure.

In an embodiment, a semiconductor device includes a hybrid channel region having a first region disposed above and spaced apart from a second region disposed above a third region. The hybrid channel region also includes a fourth region disposed between and in contact with the second and third regions. The first region, the second region and the third region consist essentially of a first semiconductor material, and the fourth region consists essentially of a second, different, semiconductor material. A gate stack is disposed on exposed surfaces of the hybrid channel region. The gate stack includes a gate dielectric layer and a gate electrode disposed on the gate dielectric layer. Source and drain regions are disposed on either side of the hybrid channel region.

In one embodiment, the first semiconductor material is silicon, and the second semiconductor material is silicon germanium.

In one embodiment, the hybrid channel region has a length between the source and drain regions, and the fourth semiconductor region is shorter than each of the first, second, and third semiconductor regions in a direction perpendicular to the length of the channel region.

In one embodiment, the third region of the hybrid channel region is continuous with a bulk semiconductor substrate.

In one embodiment, the gate stack is isolated from the bulk semiconductor substrate by a shallow trench isolation (STI) region or a bottom gate isolation (BGI) structure.

In an embodiment, a method of fabricating a hybrid geometry-based semiconductor structure involves forming an epitaxial material stack above a semiconductor substrate. The epitaxial material stack includes a first layer formed above a second layer formed above a third layer formed above a fourth layer formed on the semiconductor substrate. The first layer, the third layer and the semiconductor substrate consist essentially of a first semiconductor material. The second layer consists essentially of a second semiconductor material different than the first semiconductor material. The fourth layer consists essentially of a third semiconductor material different than the first and second semiconductor materials. The method also involves patterning the epitaxial material stack and a portion of the semiconductor substrate to form a semiconductor fin. The method also involves exposing the semiconductor fin to an etchant to completely remove one of the second and third semiconductor materials and to partially remove the other of the second and third semiconductor materials selective to the first semiconductor material. The method also involves, subsequently, forming a gate electrode stack on the semiconductor fin, with source and drain regions on either side of the gate electrode stack.

In one embodiment, exposing the semiconductor fin to the etchant involves completely removing the second layer of the epitaxial material stack. The first semiconductor material is silicon, the second semiconductor material is $Si_yGe_{1-y}$, and the third semiconductor material is $Si_xGe_{1-x}$, where x>y.

In one embodiment, exposing the semiconductor fin to the etchant involves completely removing the fourth layer of the epitaxial material stack. The first semiconductor material is silicon, the third semiconductor material is $Si_yGe_{1-y}$, and the second semiconductor material is $Si_xGe_{1-x}$, where x>y.

In one embodiment, exposing the semiconductor fin to the etchant involves wet etching with a composition such as, but not limited to, an aqueous carboxylic acid/nitric acid/HF solution or an aqueous citric acid/nitric acid/HF solution.

In one embodiment, forming the gate electrode stack involves using a replacement gate process.

What is claimed is:

1. A semiconductor device, comprising:
   a hybrid channel region comprising a first region disposed above a second region disposed above and spaced apart from a third region, and comprising a fourth region disposed between and in contact with the first and second regions, wherein the first region, the second region and the third region consist essentially of a first semiconductor material, and wherein the fourth region consists essentially of a second, different, semiconductor material;
   a gate stack disposed on exposed surfaces of the hybrid channel region, the gate stack comprising a gate dielectric layer and a gate electrode disposed on the gate dielectric layer, the gate stack completely separating the second region from the third region of the hybrid channel region; and
   source and drain regions disposed on either side of the hybrid channel region.

2. The semiconductor device of claim 1, wherein the first semiconductor material is silicon, and the second semiconductor material is silicon germanium.

3. The semiconductor device of claim 1, wherein the hybrid channel region has a length between the source and drain regions, and wherein the fourth semiconductor region is shorter than each of the first, second, and third semiconductor regions in a direction perpendicular to the length of the channel region.

4. The semiconductor device of claim 1, wherein the third region of the hybrid channel region is continuous with a bulk semiconductor substrate.

5. The semiconductor device of claim 4, wherein the gate stack is isolated from the bulk semiconductor substrate by a shallow trench isolation (STI) region or a bottom gate isolation (BGI) structure.

* * * * *